(12) United States Patent
Choi (10) Patent No.: US 10,217,497 B2
(45) Date of Patent: Feb. 26, 2019

(54) DELAY LOCKED LOOP CIRCUIT AND METHOD OF CONTROLLING SAME

(71) Applicant: WINBOND ELECTRONICS CORPORATION, Taichung (TW)

(72) Inventor: Myung Chan Choi, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

(21) Appl. No.: 15/616,435

(22) Filed: Jun. 7, 2017

(65) Prior Publication Data

US 2018/0358061 A1 Dec. 13, 2018

(51) Int. Cl.
*G11C 7/22* (2006.01)
*G11C 7/12* (2006.01)
*H03L 7/081* (2006.01)

(52) U.S. Cl.
CPC ........... *G11C 7/222* (2013.01); *G11C 7/12* (2013.01); *H03L 7/0812* (2013.01)

(58) Field of Classification Search
CPC .......... G11C 7/222; G11C 7/12; H03L 7/0812
See application file for complete search history.

(56) References Cited

U.S. PATENT DOCUMENTS

| | | | |
|---|---|---|---|
| 6,388,482 B1* | 5/2002 | Schnell | H03L 7/0814 327/158 |
| 8,086,813 B2 | 12/2011 | Gillingham et al. | |
| 8,988,966 B2 | 3/2015 | Kwak | |
| 2001/0043100 A1* | 11/2001 | Tomita | G11C 7/1072 327/158 |
| 2005/0213267 A1* | 9/2005 | Azrai | H02M 3/07 361/15 |
| 2006/0193419 A1* | 8/2006 | Maneatis | H03L 7/07 375/376 |
| 2007/0053475 A1* | 3/2007 | Li | H03K 19/1737 375/376 |
| 2008/0197899 A1* | 8/2008 | Gomm | H03L 7/0814 327/158 |
| 2009/0256541 A1* | 10/2009 | Akyildiz | G06F 1/26 323/283 |
| 2010/0188125 A1* | 7/2010 | Booth | H03L 7/0814 327/158 |
| 2010/0327926 A1* | 12/2010 | Takahashi | G11C 7/222 327/158 |
| 2011/0025383 A1* | 2/2011 | De Martini | G06F 1/24 327/143 |

(Continued)

FOREIGN PATENT DOCUMENTS

CN 106095717 A 11/2016
TW I453754 B 9/2014

*Primary Examiner* — Sung Cho
(74) *Attorney, Agent, or Firm* — Finnegan, Henderson, Farabow, Garrett & Dunner LLP (57) ABSTRACT

A memory device includes a delay locked loop (DLL) circuit to receive an external clock, and delay the external clock by a DLL delay time to provide a DLL clock, an output driver to output the DLL clock as a data strobe signal, and a DLL offset control circuit configured to receive at least one of a plurality of functional statement commands, and adjust the DLL delay time based on the at least one of the functional statement commands. Each one of the DLL circuit and the output driver is selectively powered according to the at least one of the functional statement commands.

19 Claims, 10 Drawing Sheets

(56) References Cited

U.S. PATENT DOCUMENTS

| | | | |
|---|---|---|---|
| 2012/0194240 A1* | 8/2012 | Kim | H03L 7/06 |
| | | | 327/158 |
| 2015/0109036 A1* | 4/2015 | Gomm | H03K 3/017 |
| | | | 327/158 |
| 2017/0237444 A1* | 8/2017 | Wei | H03L 7/0814 |
| | | | 327/156 |
| 2017/0288683 A1* | 10/2017 | Wei | H03L 7/0814 |

\* cited by examiner

FIG. 10

DELAY LOCKED LOOP CIRCUIT AND METHOD OF CONTROLLING SAME

FIELD OF THE DISCLOSURE

The present disclosure relates to a delay locked loop (DLL) circuit and a method for controlling the DLL circuit.

BACKGROUND

In a computer system including a memory device, the timing of signals and operations of devices external to the memory device are controlled by a system clock, while the timing of signals and operations of devices inside the memory device are controlled by an internal clock. In order to ensure integrity of signals transmitted between the memory device and external devices, the internal clock is required to be synchronized with the system clock. Usually, the memory device includes a delay locked loop (DLL) circuit which provides the internal clock based on the system clock.

SUMMARY

According to an embodiment of the disclosure, a memory device is provided. The memory device includes a delay locked loop (DLL) circuit to receive an external clock, and delay the external clock by a DLL delay time to provide a DLL clock, an output driver to output the DLL clock as a data strobe signal, and a DLL offset control circuit configured to receive at least one of a plurality of functional statement commands, and adjust the DLL delay time based on the at least one of the functional statement commands. Each one of the DLL circuit and the output driver is selectively powered according to the at least one of the functional statement commands.

According to an embodiment of the disclosure, a method of providing a data strobe signal by a delay locked loop (DLL) circuit is provided. The method includes receiving an external clock by a DLL circuit, delaying, by the DLL circuit, the external clock by a DLL delay time to provide a DLL clock, outputting the DLL clock as the data strobe signal by an output driver, receiving at least one of a plurality of functional statement commands, adjusting the DLL delay time based on the plurality of functional statement commands to provide an adjusted DLL delay time, and delaying the external clock by the adjusted DLL delay time. Each one of the DLL circuit and the output driver is selectively powered according to the at least one of the functional statement commands.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
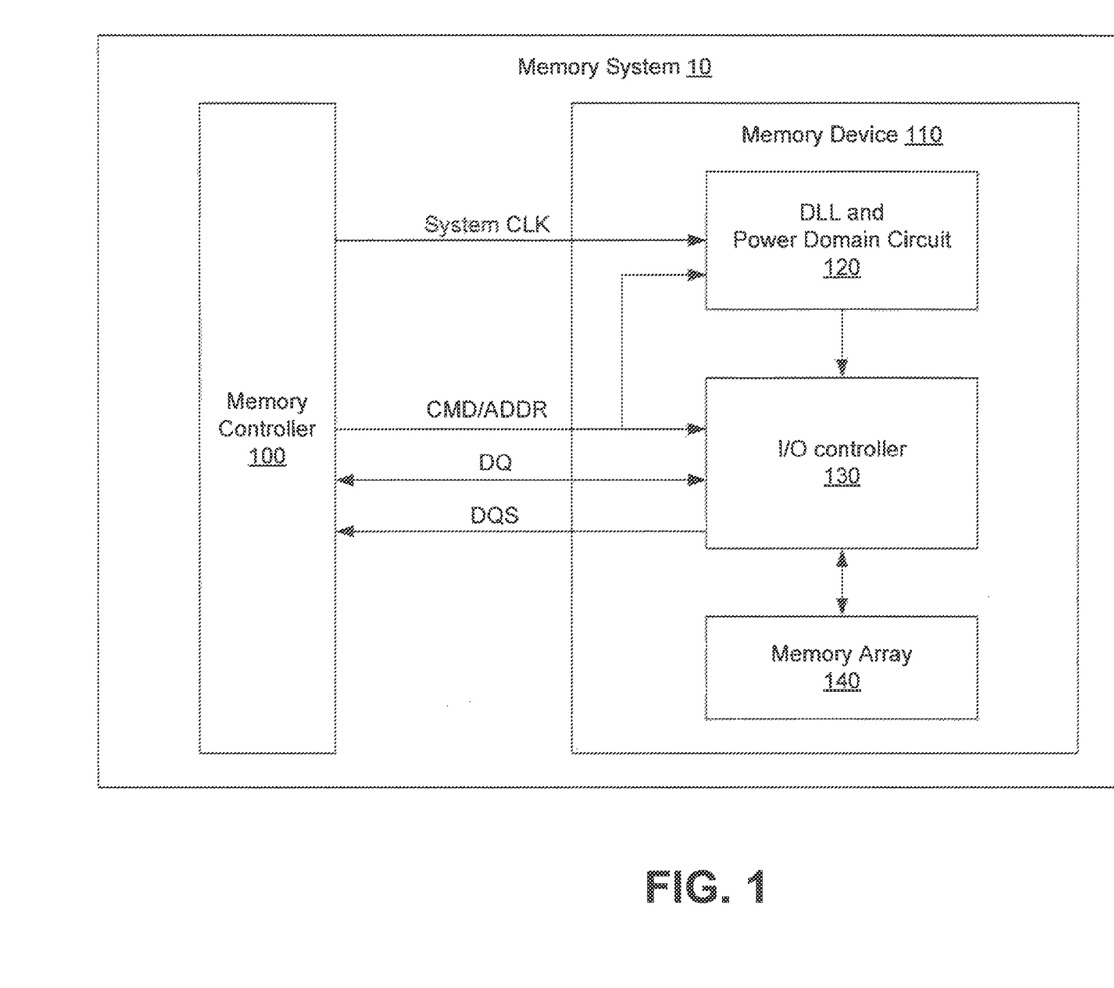
FIG. 1 is a block diagram of a memory system.

FIG. 1 is a block diagram of a memory system 10. Memory system 10 includes a memory controller 100 and a memory device 110. Memory device 110 includes a delay locked loop (DLL) and power domain circuit 120, an input/output (I/O) controller 130, and a memory array 140.

Memory controller 100 provides a command CMD, an address ADDR, and a system clock CLK to memory device 110. Command CMD can be a read command, a program command, or an erase command. When command CMD is a program command, memory controller 100 also provides data DQ to be programmed to memory device 110. When command CMD is a read command, memory controller 100 also receives data DQ read from memory device 110.

DLL and power domain circuit 120 receives system clock CLK from memory controller 100 and generates a data strobe signal DQS. Data strobe signal DQS is synchronized with system clock CLK. That is, data strobe signal DQS has the same phase as system clock CLK. DLL and power domain circuit 120 provides data strobe signal DQS to I/O controller 130, which in turn outputs data strobe signal DQS to memory controller 100.

I/O controller 130 accesses memory array 140 according to command CMD and address ADDR. When command CMD is a program command, I/O controller 130 latches the data DQ received from memory controller 100 according to data strobe signal DQS, and programs the latched data into memory array 140. When command CMD is a read command, I/O controller 130 latches the data read from memory array 140 according to data strobe signal DQS, and outputs the read data to memory controller 100 according to data strobe signal DQS.

Figure 2:
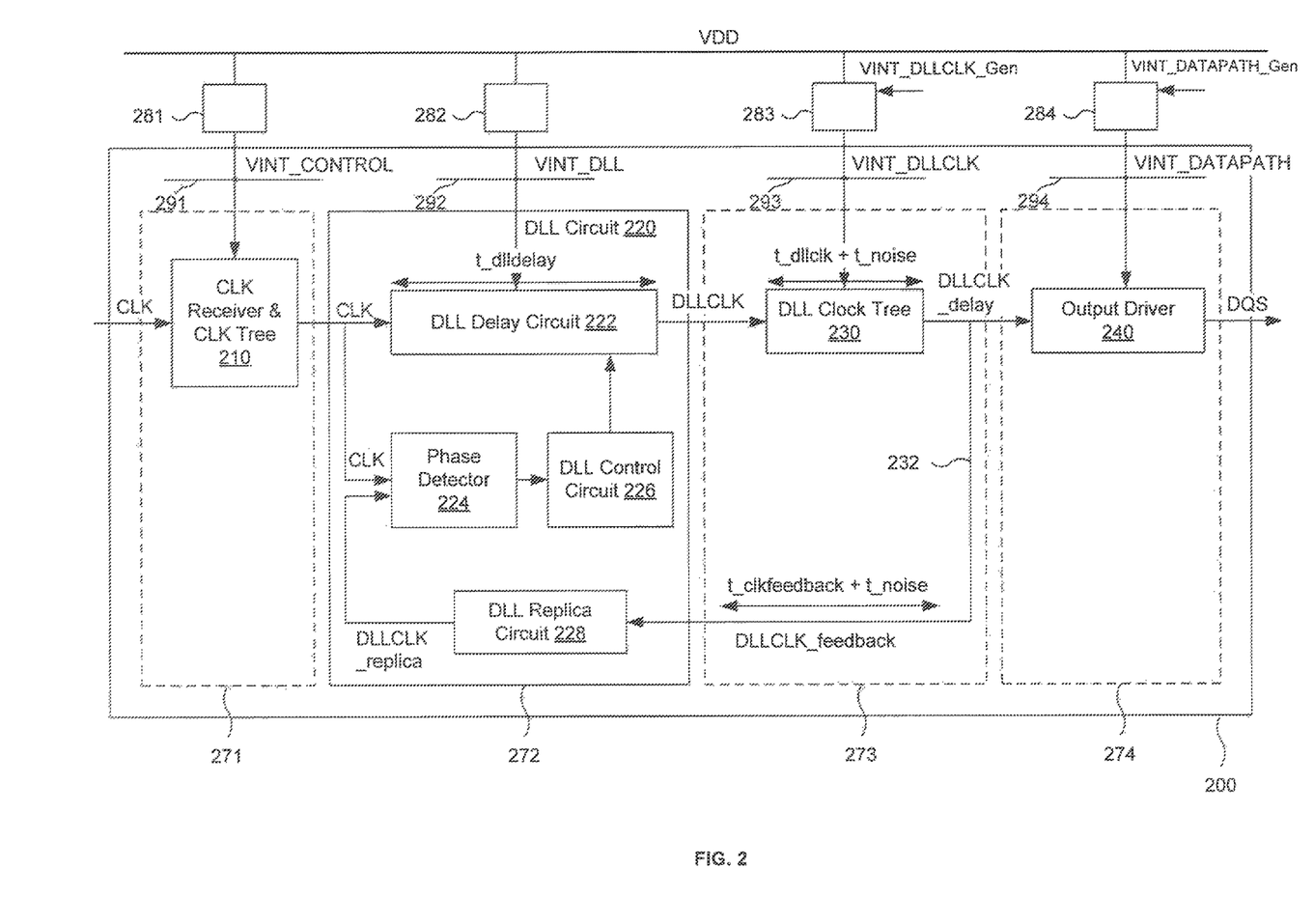
FIG. 2 is a block diagram of a DLL and power domain circuit in a memory device.

FIG. 2 is a block diagram of a DLL and power domain circuit 200. DLL and power domain circuit 200 is an example of DLL and power domain circuit 120 illustrated in FIG. 1. As illustrated in FIG. 2, DLL and power domain circuit 200 includes a clock receiver and clock tree 210, a DLL circuit 220, a DLL clock tree 230, and an output driver 240, that are connected in series. DLL circuit 220 includes a DLL delay circuit 222, a phase detector 224, a DLL control circuit 226, and a DLL replica circuit 228.

Clock receiver and clock tree 210 receives an external clock CLK, e.g., the system clock CLK issued from memory controller 100, and provides the external clock CLK to DLL delay circuit 222 and phase detector 224 of DLL circuit 220. DLL delay circuit 222 delays the external clock CLK by a DLL delay time t_dlldelay to generate a DLL clock DLL-CLK, and provides the DLL clock DLLCLK to DLL clock tree 230. DLL clock tree 230 drives the DLL clock DLLCLK to output driver 240. DLL clock tree 230 introduces a DLL clock tree delay time t_dllclk and a power noise delay time t_noise to the DLL clock DLLCLK, such that the DLL clock DLLCLK becomes a delayed DLL clock DLLCLK_delay. Output driver 240 outputs the delayed clock DLLCLK_delay as a data strobe signal DQS.

A feedback line 232 is connected between the output of DLL clock tree 230 and an input of DLL replica circuit 228 to return the delayed clock DLLCLK_delay to DLL replica circuit 228 as a feedback DLL clock DLLCLK . . . feedback. Feedback line 232 introduces a feedback delay time t_clkfeedback and a power noise delay time t_noise to the feedback DLL clock DLLCLK_feedback.

DLL replica circuit 228 is a replica of DLL clock tree 230 to compensate a delay caused by DLL clock tree 230. DLL replica circuit 228 provides a replicated DLL clock DLL-CLK_replica to phase detector 224. Phase detector 224 detects a phase difference between the external clock CLK and the replicated DLL clock DLLCLK_replica, and provides a detection result to DLL control circuit 226. Based on the detection result, DLL control circuit 226 controls DLL delay circuit 222 to adjust the DLL delay time t_dlldelay introduced by DLL delay circuit 222 to delay the external clock CLK.

DLL and power domain circuit 200 includes first to fourth power domains 271-274 that are separate from each other and are controlled by various functional statement commands. Each one of clock receiver and clock tree 210, DLL circuit 220, DLL clock tree 230, and output driver 240 is disposed within a different one of power domains 271-274. Specifically, clock receiver and clock tree 210 is disposed within first power domain 271. A first internal voltage generator 281 is connected to a power supply VDD and generates a voltage VINT_CONTROL to be supplied to a first power bus 291. Clock receiver and clock tree 210 is connected to first power bus 291 to be powered by voltage VINT_CONTROL. DLL circuit 220 is disposed within second power domain 272. A second internal voltage generator 282 is connected to the power supply VDD and generates a voltage VINT_DLL to be supplied to a second power bus 292. DLL circuit 220 is connected to second power bus 292 to be powered by voltage VINT_DLL. DLL clock tree 230 is disposed within a third power domain 273. A third internal voltage generator 283 is connected to the power supply VDD and generates a voltage VINT_DLL-CLK to be supplied to a third power bus 293. DLL clock tree 230 is connected to the third power bus 293 to be powered by voltage VINT_DLLCLK. Output driver 240 is disposed within a fourth power domain 274. A fourth internal voltage generator 284 is connected to the power supply VDD and generates a voltage VINT_DATAPATH to be supplied to a fourth power bus 294. Output driver 240 is connected to fourth power bus 294 to be powered by voltage VINT_DATAPATH. Each one of first through fourth internal voltage generators 281-284 can be a voltage regulator for generating the respectively corresponding voltage levels.

First to fourth power domains 271-274 are controlled by a plurality of functional statement commands received by DLL and power domain circuit 200. That is, the components in each one of first to fourth power domains 271-274 are selectively powered according to at least one of the plurality of functional statement commands. Specifically, first through fourth internal voltage generators 281-284 in first through fourth power domains 271-274 are controlled, i.e., enabled or disabled, by respective control signals for switching on or off the connections between clock receiver and clock tree 210, DLL circuit 220, DLL clock tree 230, and output driver 240, and the respective ones of first through fourth power buses 291-294. The control signals are internally generated based on commands received from an external controller, such as, for example, memory controller 100 in FIG. 1, based on the plurality of functional statement commands.

For example, third internal power generator 283 is controlled by a control signal VINT_DLLCLK_Gen for switching on or off the connection between DLL clock tree 230 and third power bus 293 having the voltage level VINT_DLL-CLK. The control signal VINT_DLLCLK_Gen is controlled based on at least one functional statement command such as, for example, a slow power down enter, a slow power down exit, etc. As another example, fourth internal power generator 284 is controlled by a control signal VINT_DATAPATH_Gen for switching on or off the connection between output driver 240 and fourth power bus 294 having the voltage level VINT_DATAPATH. The control signal VINT_DAT-APATH_ Gen is controlled based on at least one functional statement command such as, for example, a read command.

Figure 3:
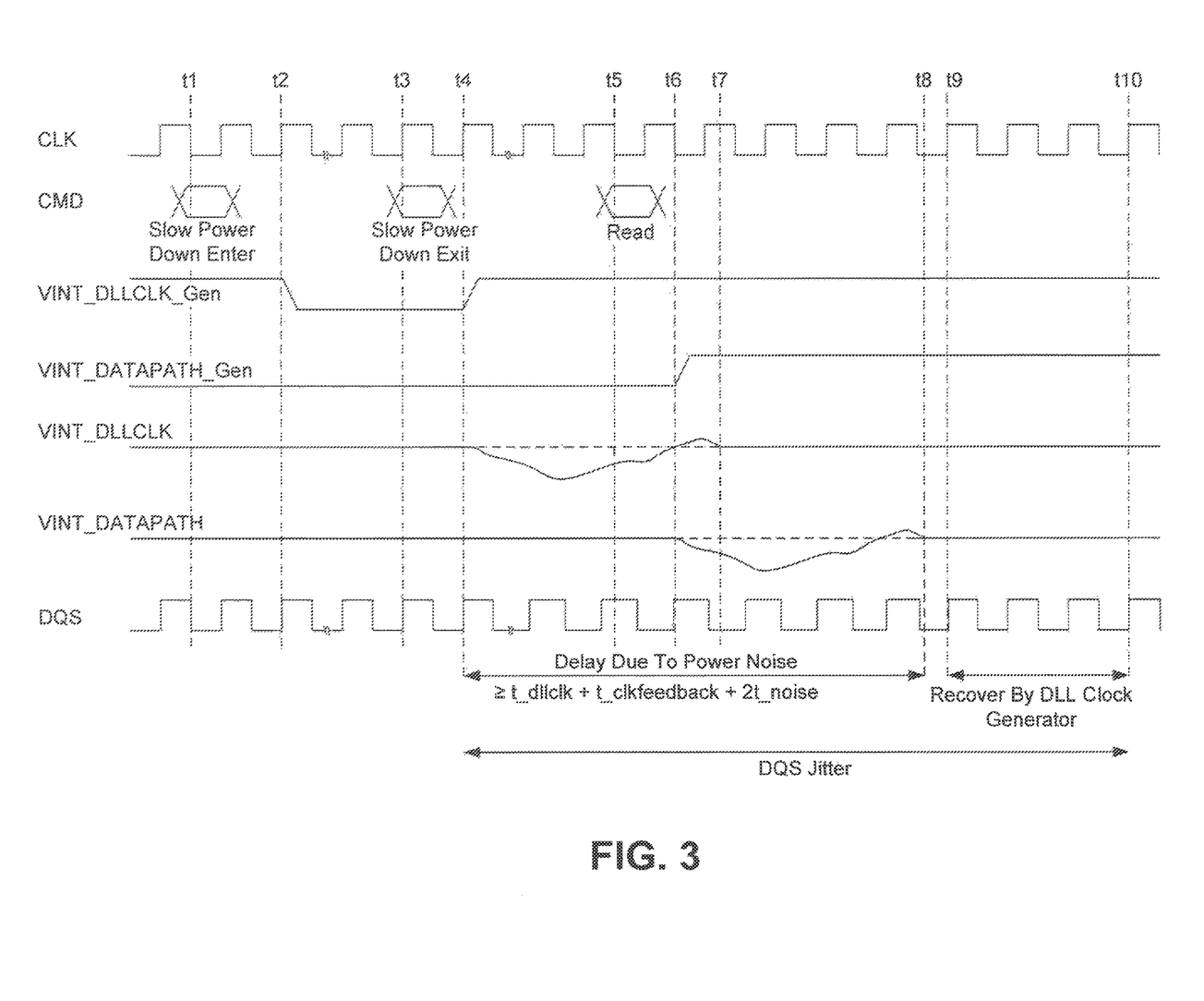
FIG. 3 is a timing diagram of various signals during operation of the DLL and power domain circuit of FIG. 2.

FIG. 3 is a timing diagram of various signals during operation of DLL and power domain circuit 200. As illustrated in FIG. 3, at time t1, DLL and power domain circuit 200 receives a "slow power down enter" command. In response, at time t2, the signal VINT_DLLCLK_Gen transitions from a high voltage level to a low voltage level to disable third internal power generator 283 in third power domain 273. As a result, the connection between DLL clock tree 230 and third power bus 293 having the voltage level VINT_DLLCLK is switched off, and thus DLL clock tree 230 does not consume any power.

At time t3, DLL and power domain circuit 200 receives a "slow power down exit" command. In response, at time t4, the signal VINT_DLLCLK_Gen transitions from the low voltage level to the high voltage level to enable third internal power generator 283 in third power domain 273. As a result, the connection between DLL clock tree 230 and third power bus 293 is switched on, and DLL clock tree 230 starts to consume power supplied from third power bus 293. Due to the load of DLL clock tree 230 added to third power bus 293, the voltage level VINT_DLLCLK on third power bus 293 begins to fluctuate, i.e., first decreases from a predetermined first voltage level, then increases above the first voltage level, and is finally stabilized at the first voltage level at time t7. As a result, power noise is generated during the period from time t4 to time t7.

At time t5 which is shortly after time t4, DLL and power domain circuit 200 receives a read command. That is, the interval between time t5 and time t4 is relatively short. In response to the read command, at time t6, the signal VINT_DATAPATH_Gen transitions from a low voltage level to a high voltage level to enable fourth internal power generator 284 in fourth power domain 274. As a result, the connection between output driver 240 and fourth power bus 294 having the voltage level VINT_DATAPATH is switched on, and output driver 240 starts to consume power supplied from fourth power bus 294. Due to the load of output driver 240 added to fourth power bus 294, the voltage level VINT_DATAPATH on fourth power bus 294 begins to fluctuate, i.e., first decreases from a predetermined second voltage level, then increases above the second voltage level, and is finally stabilized at the second level at time t9. As a result, power noise is generated during the period from time t6 to time t9.

The power noise generated during the period from time t4 to time t9, e.g., the decrease in the voltage levels VINT_DLLCLK and VINT_DATAPATH, slows down the operation of DLL and power domain circuit 200. As a result, power noise delay time t_noise is generated in DLL clock tree 230 and in feedback line 232. Thus, the delayed clock DLLCLK_delay output from DLL clock tree 230 is not only delayed by the DLL clock tree delay time t_dllclk, but also delayed by the power noise delay time t_noise. In addition, the feedback DLL clock DLLCLK_feedback arriving at DLL replica circuit 228 is not only delayed by the feedback delay time t_clkfeedback, but also delayed by the power noise delay time t_noise. Consequently, the data strobe signal DQS is delayed with respect to the external clock CLK due to power noise. That is, the phase of the data strobe signal DQS does not match the phase of the external clock CLK, and the data strobe signal DQS is not synchronized with the external clock CLK. Although DLL and power domain circuit 200 can adjust the data strobe signal DQS to compensate the mis-match between the data strobe signal DQS and the external clock CLK, DLL and power domain circuit 200 cannot perform the adjustment until after the feedback DLL clock DLLCLK_feedback arrives at DLL replica circuit 228 at time t8. Due to the delay by DLL clock tree 230 and the feedback line, the time period from time t4 to t8 is equal to, or is even greater than, t_dllclk+t_clkfeedback+2t_noise.

At time t9, DLL circuit 220 starts to adjust the data strobe signal DQS to compensate for the mis-match between the data strobe signal DQS and the external clock CLK. Finally, at time t10, the data strobe signal DQS is recovered to be synchronized with the external clock CLK.

The mis-match between the data strobe signal DQS and the external clock CLK due to the power noise is referred to as "DQS jitter." DQS jitter may cause bit error. For example, referring to FIG. 1, during a read operation, data is clocked out from I/O controller 130 of memory device 110 according to the data strobe signal DQS, while memory controller 100 operates according to the external clock CLK. If the data strobe signal DQS does not match the external clock CLK, the data clocked out from I/O controller 130 may not be correctly received by memory controller 100, and bit error may be generated. In order to reduce the bit error, DQS jitter is required to be controlled within a certain window. However, as the operation speed of memory system 10 increases, the window size of DQS jitter shrinks and thus it becomes more difficult to control the DQS jitter.

In order to reduce the effect caused by DQS jitter, according to an embodiment of the present disclosure, a DLL offset control circuit is included in a DLL and power domain circuit to adjust a DLL delay time during a predetermined period after receiving one or more functional statement commands that are related to power domain control.

Figure 4:
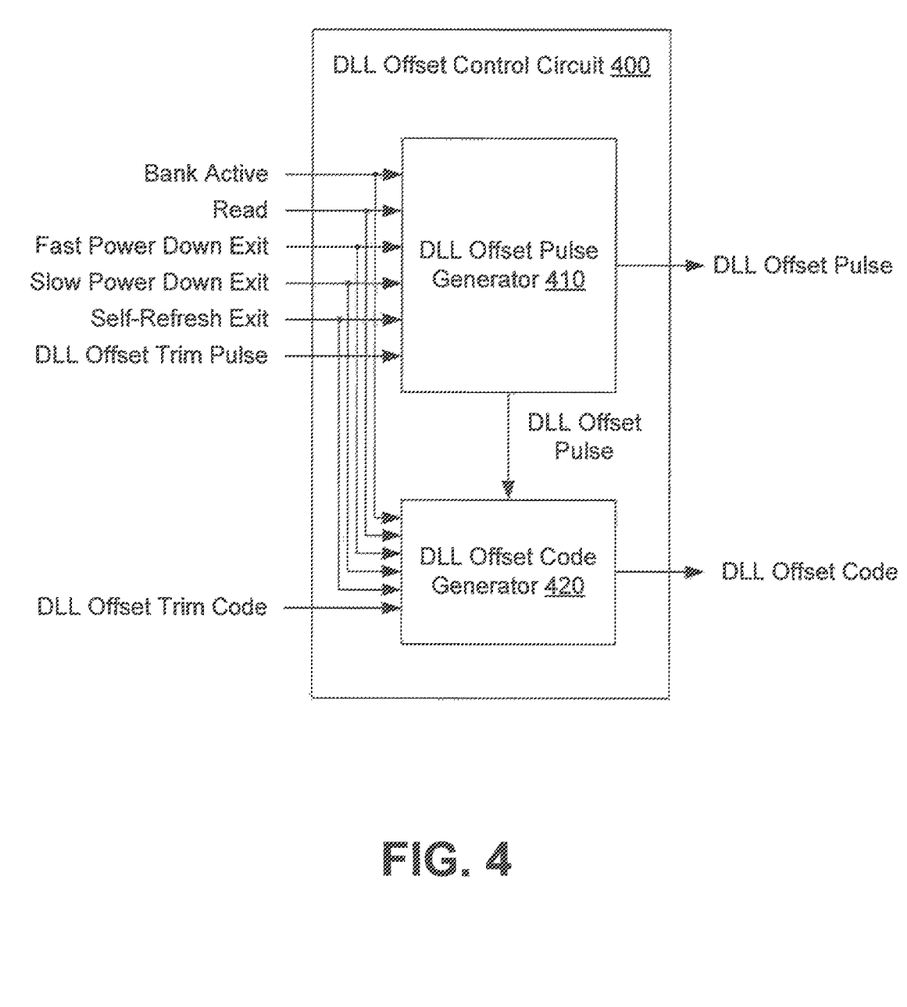
FIG. 4 is a block diagram of a DLL offset control circuit, consistent with an illustrated embodiment.

FIG. 4 is a block diagram of a DLL offset control circuit 400, consistent with an illustrated embodiment. DLL offset control circuit 400 includes a DLL offset pulse generator 410 and a DLL offset code generator 420.

DLL offset pulse generator 410 receives one or more functional statement commands from an external controller, e.g., memory controller 100 in FIG. 1, and generates a DLL offset pulse based on the received commands and a DLL offset trim pulse. The functional statement command can be any command that, when implemented, affects control of at least one power domain in a DLL and power domain circuit, i.e., switching on or off the connection between at least one component in the DLL circuit and a power bus. For example, the functional statement command can be a bank active command, a read command, a fast power down exit command, a slow power down exit command, and a self-refresh exit command, etc.

Based on the one or more functional statement commands, DLL offset pulse generator 410 determines a pulse width of the DLL offset pulse. The pulse width represents a period during which DLL offset control circuit 400 adjusts the DLL delay time. The pulse width can be different for different functional statement commands or different combinations of functional statement commands received by DLL offset control circuit 400. DLL offset pulse generator 410 provides the DLL offset pulse to DLL offset code generator 420. In some embodiments, DLL offset pulse generator 410 also outputs the DLL offset pulse to a device external to DLL offset control circuit 400.

In some embodiments, a DLL offset trim pulse is provided to DLL offset pulse generator 410 by a user or an external controller. Based on the DLL offset trim pulse, DLL offset pulse generator 410 further adjusts the pulse width of the DLL offset pulse to compensate for process, voltage, and temperature (PVT) variation.

DLL offset code generator 420 receives the one or more functional statement commands from the external controller, and the DLL offset pulse from DLL offset pulse generator 410, generates a DLL offset code based on the received commands and the DLL offset pulse, and outputs the DLL offset code to a device external to DLL offset control circuit 400. The DLL offset code represents an offset applied to the DLL delay time. The DLL offset code can be different for different functional statement commands or different combinations of functional statement commands received by DLL offset control circuit 400.

DLL offset pulse generator 410 and DLL offset code generator 420 can be logic circuits or analog circuits that are configured to generate the DLL offset pulse or the DLL offset code based on the one or more functional statement commands received from the external controller.

In some embodiments, a DLL offset trim code is provided to DLL offset code generator 420 by a user or an external controller. For example, the DLL offset trim code can be generated when memory device 110 is operated in a memory internal test mode. Alternatively, the DLL offset trim code can be generated by a fuse. Based on the DLL offset trim code, DLL offset code generator 420 further adjusts the DLL offset code to compensate for process, voltage, and temperature (PVT) variation.

Figure 5:
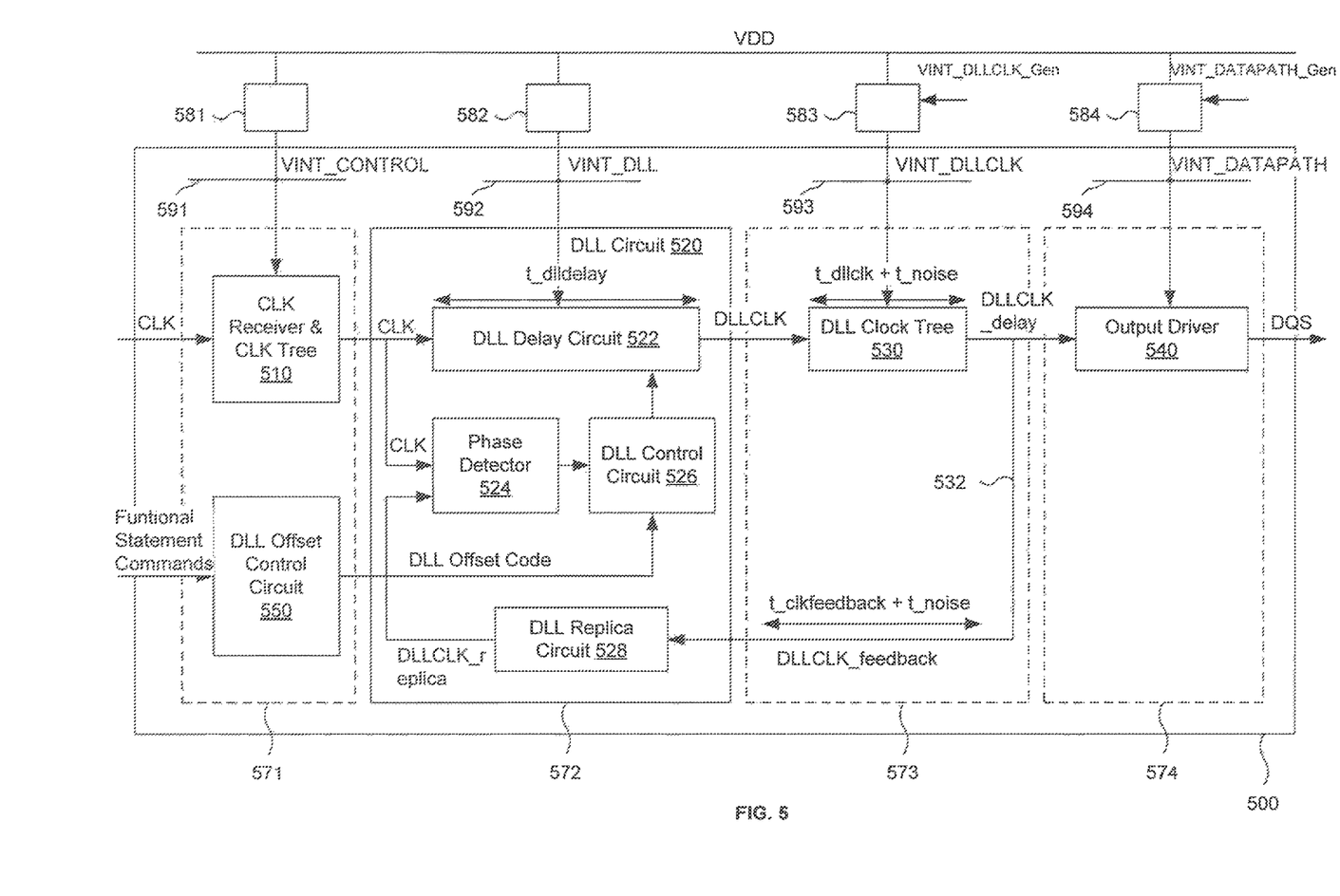
FIG. 5 is a block diagram of a DLL and power domain circuit in a memory device, consistent with an illustrated embodiment.

FIG. 5 is a block diagram of a DLL and power domain circuit 500, consistent with an illustrated embodiment. DLL and power domain circuit 500 includes a clock receiver and clock tree 510, a DLL circuit 520, a DLL clock tree 530, and an output driver 540, that are connected in series. DLL circuit 520 includes a DLL delay circuit 522, a phase detector 524, a DLL control circuit 526, and a DLL replica circuit 528. A feedback line 532 is connected between the output of DLL clock tree 530 and an input of DLL replica circuit 528. DLL and power domain circuit 500 further includes a DLL offset control circuit 550 connected to DLL control circuit 526. In DLL and power domain circuit 500, the structure and function of clock receiver and clock tree 510, DLL delay circuit 522, phase detector 524, DLL replica circuit 528, DLL clock tree 530, and output driver 540, are substantially the same as clock receiver and clock tree 210, DLL delay circuit 222, phase detector 224, DLL replica circuit 228, DLL clock tree 230, and output driver 240 of DLL and power domain circuit 200 illustrated in FIG. 2. Therefore, detailed descriptions of these components are not repeated.

In DLL and power domain circuit 500, clock receiver and clock tree 510 and DLL offset control circuit 550 are disposed in first power domain 571; DLL circuit 520 is disposed in second power domain 572; DLL clock tree 530 is disposed in third power domain 573; and output driver 540 is disposed in fourth power domain 574. First through fourth power domains 571-574 are separate from each other and are controlled by a plurality of function state commands. First through fourth internal voltage generators 581-584 are connected to first through fourth power buses 591-594 for supplying power to the components disposed within first through fourth power domains 571-574. The structure and function of first through fourth power domains 571-574, first through fourth internal voltage generators 581-584, and first through fourth power buses 591-594 of DLL and power domain circuit 500 are substantially the same as first through fourth power domains 271-274, first through fourth internal voltage generators 281-284, and first through fourth power buses 291-294 of DLL and power domain circuit 200 illustrated in FIG. 2. Therefore, detailed descriptions of these components are not repeated.

DLL offset control circuit 550 can be implemented by DLL offset control circuit 400 illustrated in FIG. 4. DLL offset control circuit 550 is configured to, in response to receiving one or more functional statement commands that, when implemented, affect power domain control of DLL and power domain circuit 500, output a DLL offset code to DLL control circuit 526. Based on the DLL offset code, DLL control circuit 526 controls the DLL delay time t_dlldelay used by DLL delay circuit 522 for delay the external clock CLK.

Figure 6:
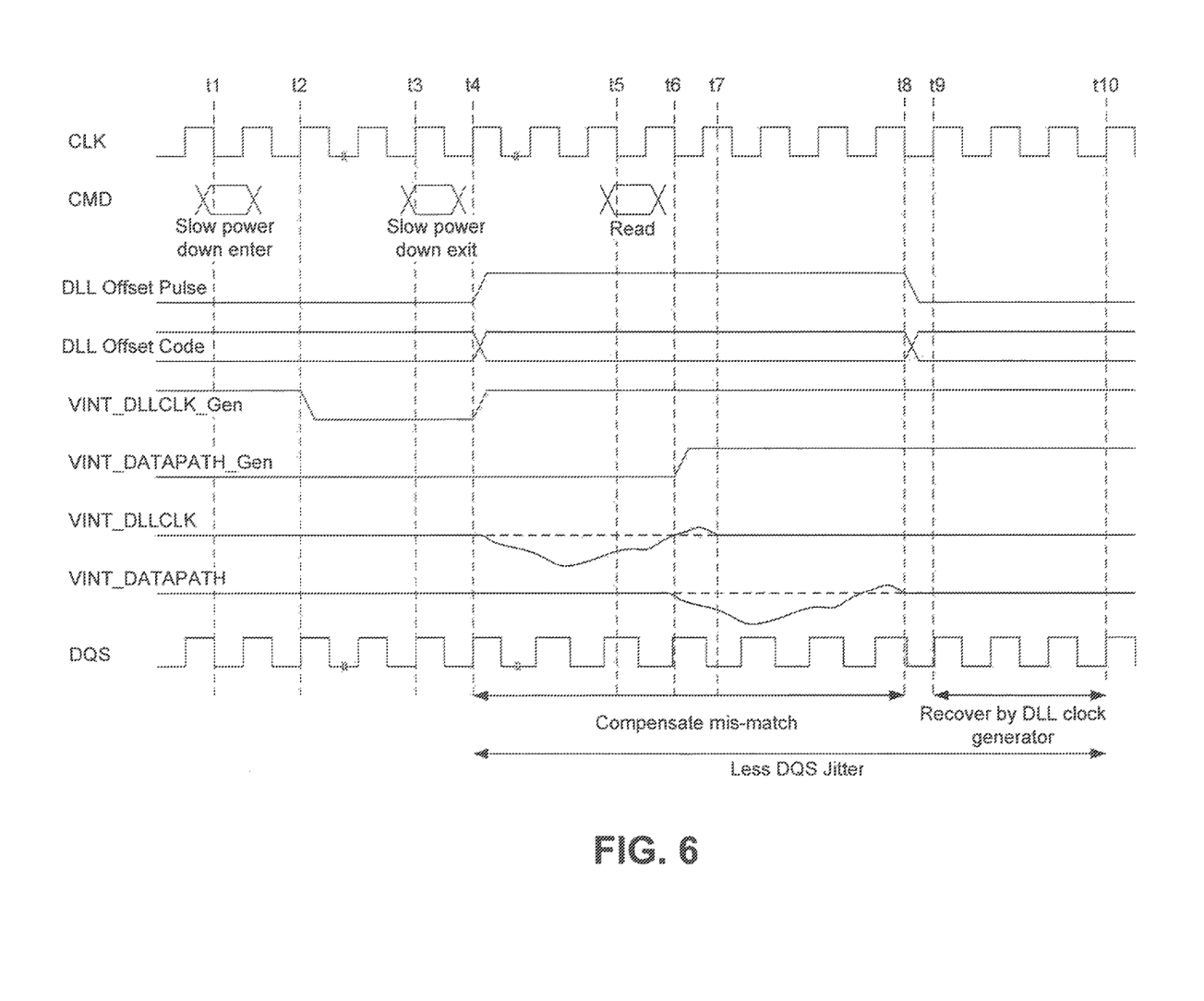
FIG. 6 is a timing diagram of various signals during operation of the DLL and power domain circuit of FIG. 5, consistent with an illustrated embodiment.

FIG. 6 is a timing diagram of various signals during operation of DLL and power domain circuit 500, consistent with an illustrated embodiment. The operation of DLL and power domain circuit 500 at times t1, t2, t3, t5, t6, t7, t8, t9, and t10 is substantially the same as the operation of DLL and power domain circuit 200. Therefore, detailed description thereof is not repeated.

As described with reference to FIG. 3, in response to receiving a "slow power down exit" command at time t3 and receiving a read command at time t5, power noise is generated during the period from time t4 to time t8. In the embodiment illustrated in FIG. 6, DLL offset control circuit 550 generates a DLL offset pulse and a DLL offset code during the period from time t4 to time t8. The pulse width of the DLL offset pulse represents a period during which DLL offset control circuit 550 adjusts a DLL delay time t_dlldelay provided by DLL delay circuit 522, and the DLL offset code represents an offset applied to the DLL delay time t_dlldelay.

For example, the DLL offset code can be a code that reduces the DLL delay time t_dlldelay. As a result, the delay time of the DLL clock DLLCLK output from DLL delay circuit 522 is reduced compared to a case when the DLL offset code is not provided to DLL delay circuit 522. The reduction of the delay time of the DLL clock DLLCLK compensates for the delay caused by the power noise generated in DLL clock tree 530 and feedback line 532 during the period from time t4 to time t8. As a result, the mismatch between the data strobe signal DQS and the external clock CLK from time t4 to time t8 can be reduced, and the effect of DQS jitter is reduced.

After time t8, DLL offset control circuit 550 stops providing the DLL offset code and DLL offset pulse to DLL and power domain circuit 500, and thus the DLL delay time of the DLL clock DLLCLK is only determined based on the phase difference between the DLLCLK_replica and the external clock CLK. At this time, the fluctuations of the voltage levels VINT_DLLCLK and VINT_DATAPATH are attenuated, and thus the effect of the power noise on the delay time is reduced.

Figure 7:
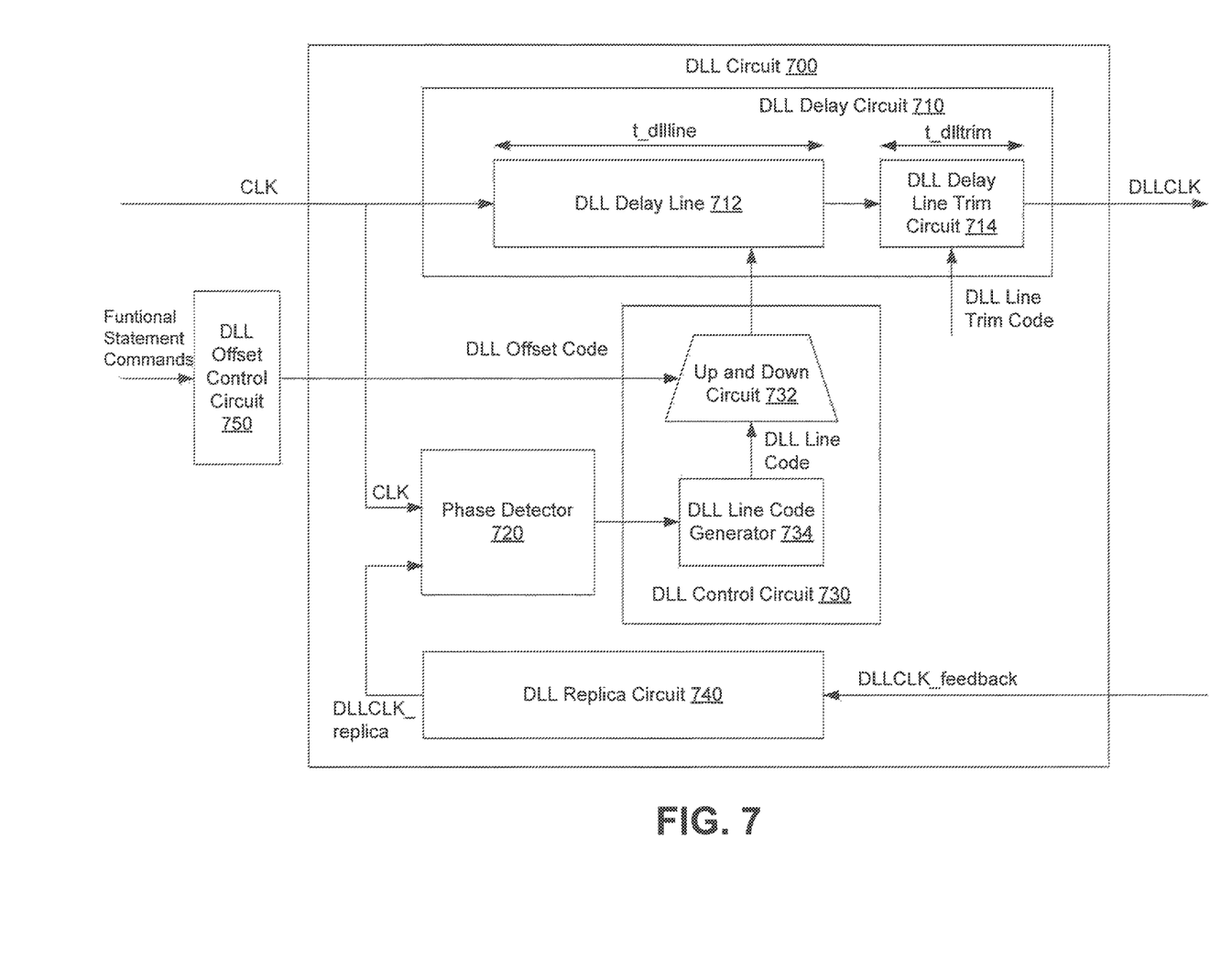
FIG. 7 is a block diagram of a DLL circuit and a DLL offset control circuit, consistent an illustrated embodiment.

FIG. 7 is a block diagram of a DLL circuit 700 and a DLL offset control circuit 750, consistent an illustrated embodiment. DLL circuit 700 can be implemented as DLL circuit 520 in FIG. 5, and DLL offset control circuit 750 can be implemented as DLL offset control circuit 550 in FIG. 5.

DLL circuit 700 includes a DLL delay circuit 710, a phase detector 720, a DLL control circuit 730, and a DLL replica circuit 740. DLL delay circuit 710 includes a DLL delay line 712 and a DLL delay line trim circuit 714. DLL control circuit 730 includes an up and down circuit 732 and a DLL line code generator 734. DLL offset control circuit 750 is connected to up and down circuit 732.

In operation, DLL delay line 712 receives the external clock CLK, delays the external clock CLK by a DLL line delay time t_dllline, and provides the delayed clock to DLL delay line trim circuit 714. The DLL line delay time t_dllline is controlled by a DLL line code provided by DLL line code generator 734. DLL delay line trim circuit 714 further delays the delayed clock by a DLL trim delay time t_dlltrim and outputs a DLL clock DLLCLK. The DLL trim delay time t_dlltrim is controlled by a DLL line trim code provided by a user or an external controller. The sum of the DLL line delay time t_dllline and the DLL trim delay time t_dlltrim constitutes the DLL delay time t_dlldelay applied by DLL delay circuit 710 to the external clock CLK. That is, t_dlldelay=t_dllline+t_dlltrim.

The DLL clock DLLCLK is provided to a DLL clock tree such as DLL clock tree 530 of FIG. 5, which outputs a delayed DLL clock DLLCLK_delay. The delayed DLL clock DLLCLK_delay returns to DLL replica circuit 740 via a feedback line, such as feedback line 532 in FIG. 5, as a feedback DLL clock DLLCLK_feedback.

DLL replica circuit 740 receives the feedback DLL clock DLLCLK_feedback, and provides a replicated DLL clock DLLCLK_replica to phase detector 720. Phase detector 720 detects a phase difference between the external clock CLK and the replicated DLL clock DLLCLK_replica, and provides a detection result to DLL line code generator 734. Based on the detection result, DLL line code generator 734 generates the DLL line code, and provides the DLL line code to up and down circuit 732, to increase, decrease, or freeze the DLL trim delay time t_dlltrim.

DLL offset control circuit 750 is a logic circuit which is configured to, in response to receiving one or more functional statement commands that are related to power domain control of a DLL circuit, such as DLL and power domain circuit 500 of FIG. 5, generate a DLL offset code based on a combination of the one or more functional statement commands and provide the DLL offset code to up and down circuit 732. For example, the DLL offset code can indicate "one code up," "two codes down," or "keep", etc.

In response to receiving the DLL line code and the DLL offset code, up and down circuit 732 adjusts or maintain the DLL line code based on the DLL offset code. For example, if the DLL offset code indicates "one code up," then up and down circuit 732 increases the DLL line code by one code. If the DLL offset code indicates "two codes down," then up and down circuit 732 decreases the DLL line code by two codes. If the DLL offset code indicates "keep," then up and down circuit 732 keep the DLL line code as is. Up and down circuit 732 then provides the adjusted DLL line code to DLL delay line 712. DLL delay line 712 then adjusts the DLL line delay time t_dllline based on the adjusted DLL line code. In this manner, the DLL delay time t_dlldelay (t_dllline+t_dlltrim) can be adjusted by DLL offset control circuit 750 to compensate for a delay of the DLL clock DLLCLK by power noise.

Figure 8:
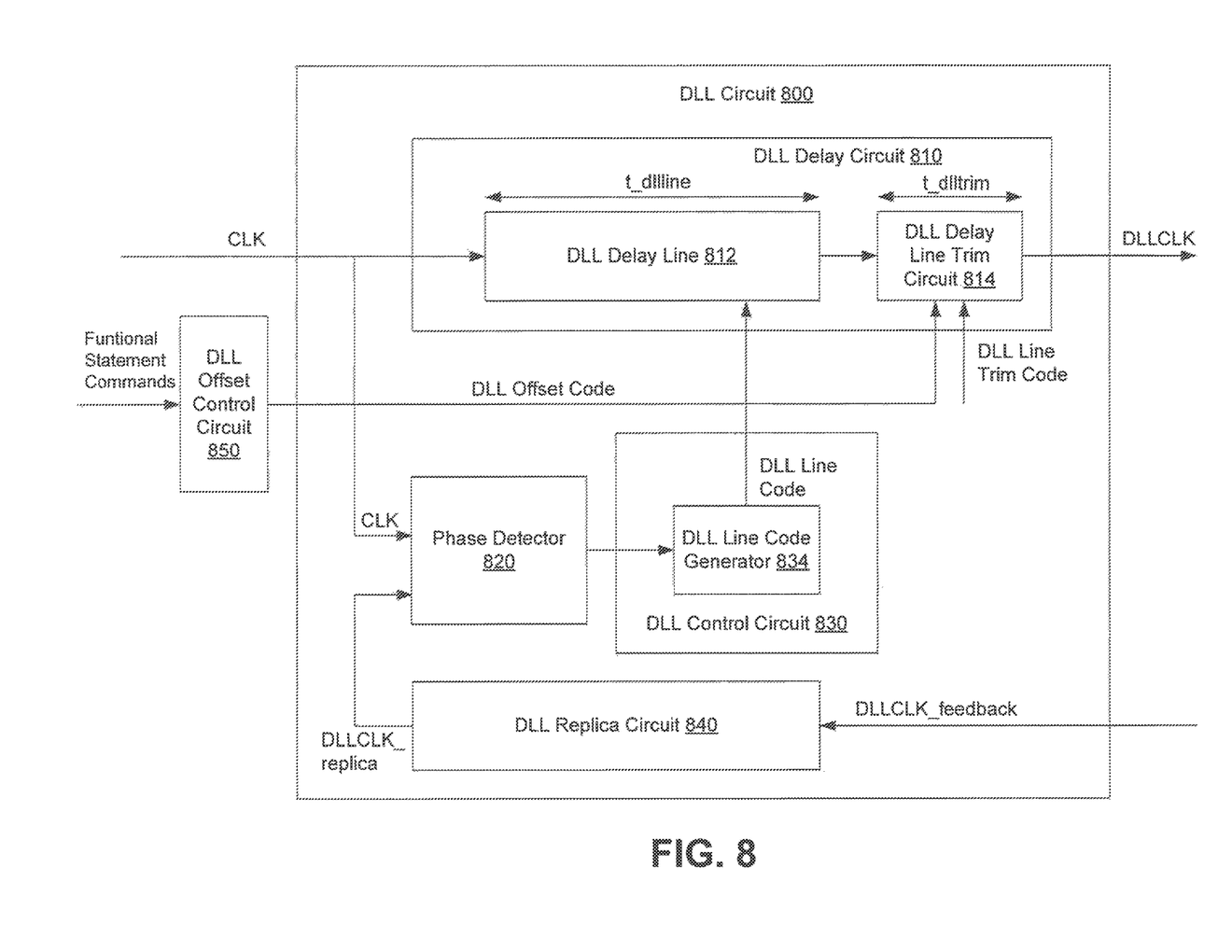
FIG. 8 is a block diagram of a DLL circuit and a DLL offset control circuit, consistent with an illustrated embodiment.

FIG. 8 is a block diagram of a DLL circuit 800 and a DLL offset control circuit 850, consistent with an illustrated embodiment. DLL circuit 800 can be implemented as DLL circuit 520 in FIG. 5, and DLL offset control circuit 850 can be implemented as DLL offset control circuit 550 in FIG. 5.

DLL circuit 800 includes a DLL delay circuit 810, a phase detector 820, a DLL control circuit 830, and a DLL replica circuit 840. DLL delay circuit 810 includes a DLL delay line 812 and a DLL delay line trim circuit 814. DLL control circuit 830 includes a DLL line code generator 834. DLL offset control circuit 850 is connected to DLL delay line trim circuit 814.

The operations of DLL delay line 812, phase detector 820, and DLL replica circuit 840 are substantially the same as that of DLL delay line 712, phase detector 720, and DLL replica circuit 740 of FIG. 7. Therefore, detailed description of these components is not repeated.

In operation, DLL delay line 812 receives the external clock CLK, delays the external clock CLK by a DLL line delay time t_dllline, and provides the delayed clock to DLL delay line trim circuit 814. The DLL line delay time t_dllline is controlled by a DLL line code provided by DLL line code generator 834. DLL delay line trim circuit 814 further delays the delayed clock by a DLL trim delay time t_dlltrim and outputs a DLL clock DLLCLK. The DLL trim delay time t_dlltrim is controlled by a DLL line trim code provided by a user or an external controller. The sum of the DLL line delay time t_dllline and the DLL trim delay time t_dlltrim constitutes the DLL delay time t_dlldelay applied by DLL delay circuit 810 to the external clock CLK. That is, t_dlldelay=t_dllline+t_dlltrim.

When DLL offset control circuit 850 receives one or more functional statement commands that are related to power domain control of a DLL circuit, DLL offset control circuit 850 generates a DLL offset code based on a combination of the one or more functional statement commands and provides the DLL offset code to DLL delay line trim circuit 814.

DLL delay line trim circuit 814 receives the DLL offset code from DLL offset control circuit 850, and adjust the DLL trim time t_dlltrim based on the DLL offset code. Then, DLL delay line trim circuit 814 delays the delayed clock output from DLL delay line 812 based on the adjusted DLL trim time t_dlltrim. In this manner, the DLL delay time t_dlldelay (t_dllline+t_dlltrim) can be adjusted by DLL offset control circuit 850 to compensate a delay of the DLL clock DLLCLK by power noise.

Figure 9:
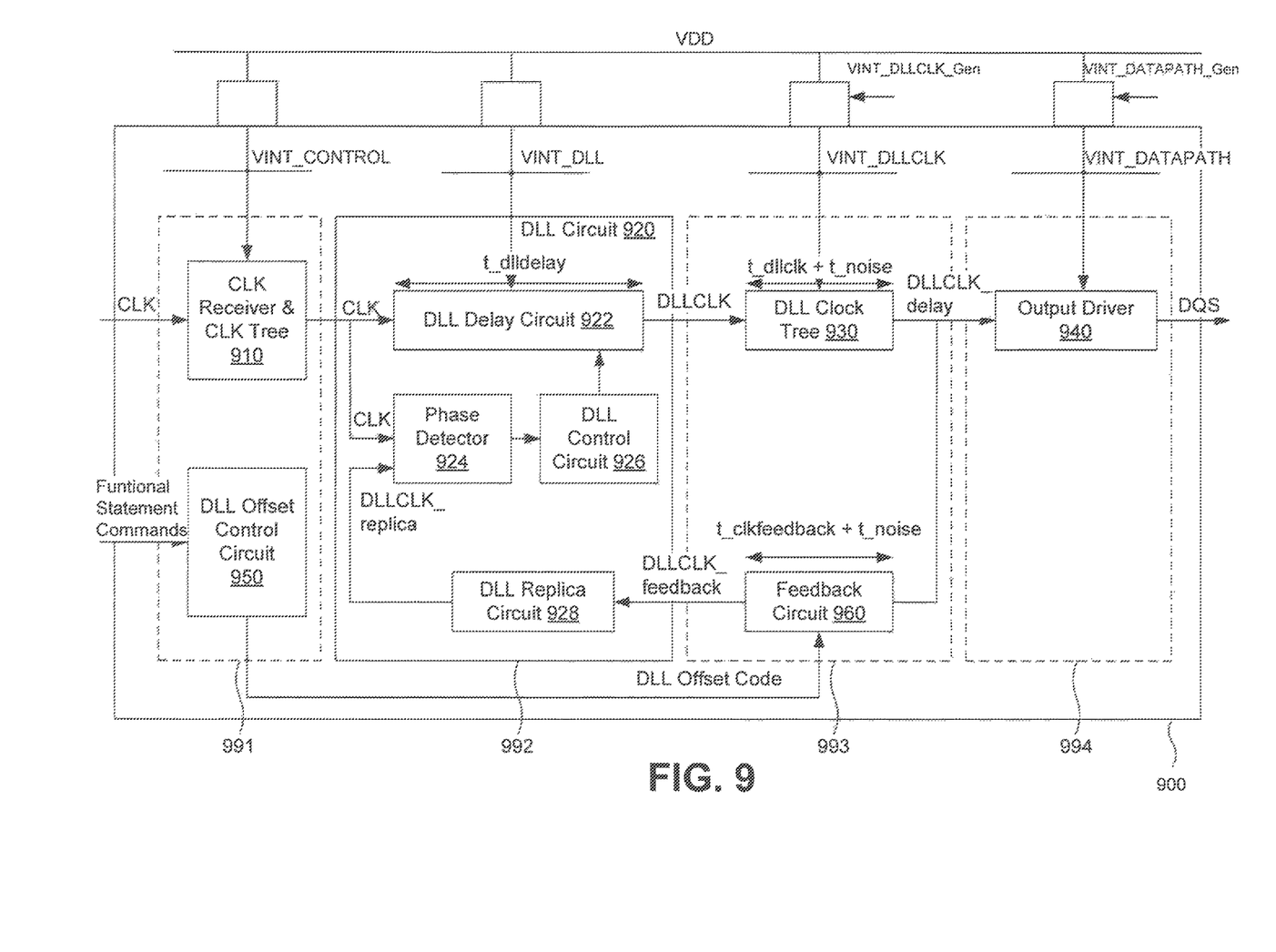
FIG. 9 is a block diagram of a DLL and power domain circuit in a memory device, consistent with an illustrated embodiment.

FIG. 9 is a block diagram of a DLL and power domain circuit 900, consistent with an illustrated embodiment. DLL and power domain circuit 900 includes a clock receiver and clock tree 910, a DLL circuit 920, a DLL clock tree 930, and an output driver 940, that are connected in series. DLL circuit 920 includes a DLL delay circuit 922, a phase detector 924, a DLL control circuit 926, and a DLL replica circuit 928. DLL and power domain circuit 900 further includes a DLL offset control circuit 950 and a feedback circuit 960. In DLL and power domain circuit 900, the structure and function of clock receiver and clock tree 910, DLL delay circuit 922, phase detector 924, DLL control circuit 926, DLL replica circuit 928, DLL clock tree 930, and output driver 940, are substantially the same as clock receiver and clock tree 210, DLL delay circuit 222, phase detector 224, DLL control circuit 226, DLL replica circuit 228, DLL clock tree 230, and output driver 240 of DLL and power domain circuit 200 illustrated in FIG. 2. Therefore, detailed descriptions of these components are not repeated.

In DLL and power domain circuit 900, clock receiver and clock tree 910 and DLL offset control circuit 950 are disposed in a first power domain 991; DLL circuit 920 is disposed in a second power domain 992; DLL clock tree 930 is disposed in a third power domain 993; and output driver 940 is disposed in a fourth power domain 994. First through fourth power domains 991-994 are separate from each other and are controlled by a plurality of function state commands. Although not illustrated in FIG. 9, internal voltage generators are connected to first through fourth power buses for supplying power to the components disposed within first through fourth power domains 991-994.

Feedback circuit 960 is connected between the output of DLL clock tree 930 and the input of DLL replica circuit 928. Feedback circuit 960 receives a delayed DLL clock DLLCLK_delay, and provides a feedback DLL clock DLLCLK_feedback to DLL replica circuit 928. Feedback circuit 960 introduces a feedback delay time t_clkfeedback and a power noise delay time t_noise to the feedback DLL clock DLLCLK_feedback. DLL offset control circuit 950 is connected to feedback circuit 960 and is configured to provide a DLL offset code to feedback circuit 960 after receiving one or more functional statement commands that are related to power domain control. The DLL offset code controls the feedback delay time t_clkfeedback.

Figure 10:
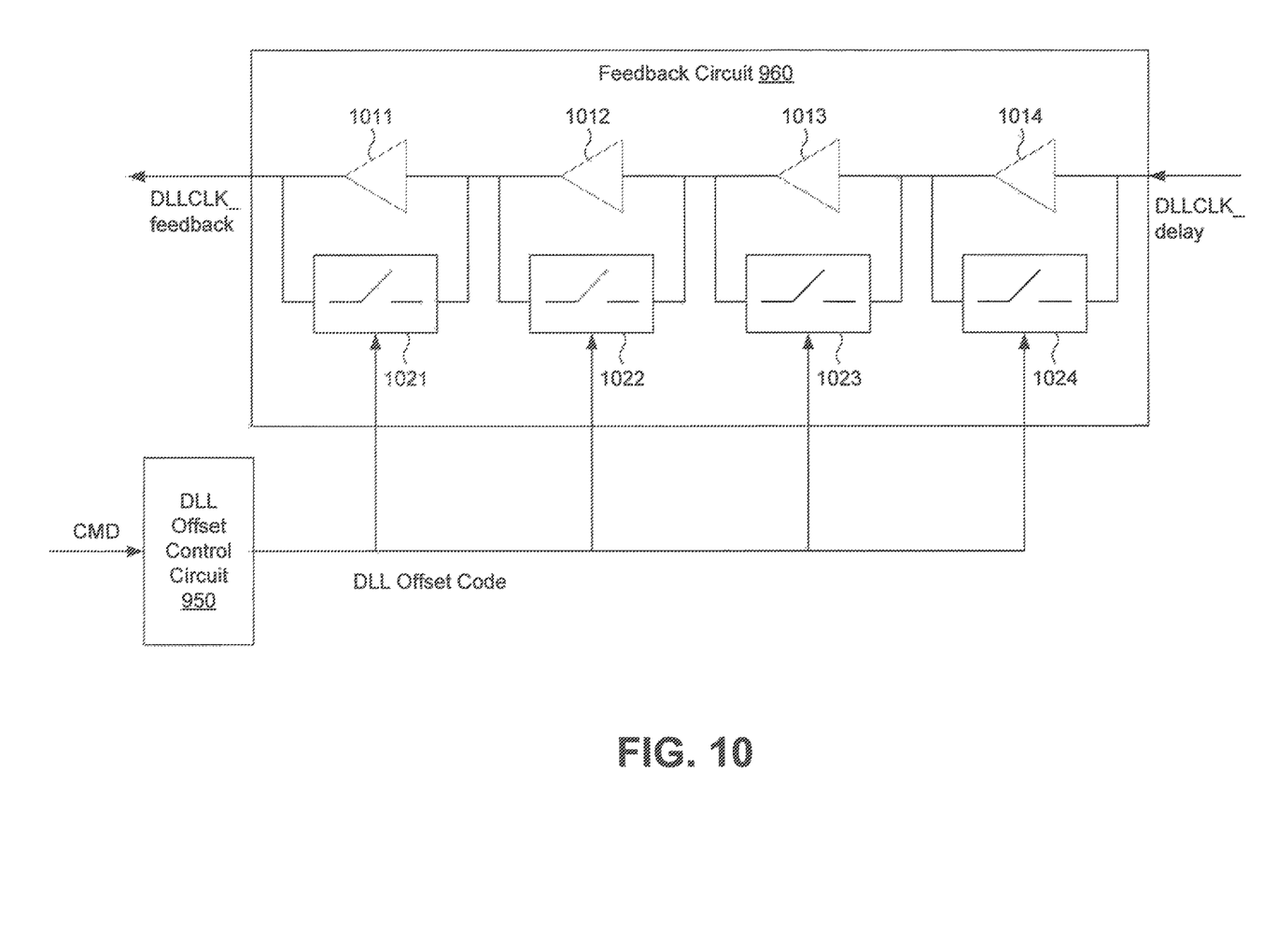
FIG. 10 is a block diagram of a DLL offset control circuit and a feedback circuit, consistent with an illustrated embodiment.

FIG. 10 is a block diagram of DLL offset control circuit 950 and feedback circuit 960, consistent with an illustrated embodiment. Feedback circuit 960 includes a plurality of delay cells 1011-1014 connected in series, and a plurality of switches 1021-1024 connected in parallel with respective ones of the plurality of delay cells 1011-1014. That is, each one of switches 1021-1024 is connected in parallel with a corresponding one of delay cells 1011-1014. Each one of delay cells 1011-1014 provides a unit delay time t_unit to the feedback DLL clock DLLCLK_feedback.

The DLL offset code provided by DLL offset control circuit 950 controls the switching on or off of the plurality of switches 1021-1024. When a switch is switched on, the corresponding delay cell does not provide the unit delay time to the feedback DLL clock DLLCLK_feedback. For example, if the DLL offset code switches on switches 1021 and 1022, delay cells 1011 and 1012 are bypassed and only delay cells 1013 and 1014 will each provide a unit delay time t_unit to the feedback DLL clock DLLCLK_feedback. In such case, the feedback delay time t_clkfeedback=2t_unit. In this manner, the feedback delay time t_clkfeedback can be adjusted by DLL offset control circuit 950 to compensate for a delay of the DLL clock DLLCLK by power noise.

Although feedback circuit 960 illustrated in FIG. 10 includes four delay cells 1011-1014 and four switches 1021-1024, the present disclosure is not limited thereto. Feedback circuit 960 can include any number of delay cells and corresponding switches.

Although DLL circuits 520, 700, and 800 illustrated in FIGS. 5, 7, and 8 include a DLL delay circuit, a phase detector, a DLL control circuit, and a DLL replica circuit, the present disclosure is not limited thereto. The DLL circuit according to the embodiment of the disclosure can be any circuit that can provide a DLL delay time to the external clock and the DLL delay time can be adjusted by a DLL offset control circuit.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device, comprising:
    a plurality of power domains separated from each other, including a first power domain including a first power bus having a first voltage level, a second power domain including a second power bus having a second voltage level, and a third power domain including a third power bus having a third voltage level;
    a delay locked loop (DLL) circuit disposed in the first power domain and configured to receive an external clock, and delay the external clock by a DLL delay time to provide a DLL clock;
    an output driver disposed in the second power domain and configured to output the DLL clock as an internal clock; and
    a DLL offset control circuit disposed in the third power domain and configured to receive at least one of a plurality of functional statement commands, and adjust the DLL delay time based on the at least one of the functional statement commands,
    wherein the functional statement commands control a connection between the DLL circuit and the first power bus in the first power domain, a connection between the output driver and the second power bus in the second power domain, and a connection between the DLL offset control circuit and the third power bus in the third power domain.

2. The memory device of claim 1, wherein the DLL offset control circuit includes:
    a DLL offset pulse generator to generate a DLL offset pulse based on the at least one of the functional statement commands received by the DLL offset control circuit.

3. The memory device of claim 2, wherein the DLL offset pulse generator is configured to receive a DLL offset trim pulse, and adjust the DLL offset pulse based on the DLL offset trim pulse.

4. The memory device of claim 1, wherein the DLL offset control circuit includes:
    a DLL offset code generator to generate a DLL offset code based on the at least one of the functional statement commands received by the DLL offset control circuit.

5. The memory device of claim 4, wherein the DLL offset code generator is configured to receive a DLL offset trim code, and adjust the DLL offset code based on the DLL offset trim code.

6. The memory device of claim 4, wherein the DLL circuit includes:
    a DLL delay circuit including:
        a DLL delay line configured to delay the external clock by the DLL delay time based on a DLL line code; and
        a DLL delay line trim circuit configured to delay the external clock by a DLL trim time based on a DLL line trim code; and
    a DLL control circuit including a DLL line code generator configured to generate the DLL line code based on a difference between the external clock and the DLL clock.

7. The memory device of claim 6, wherein the DLL control circuit further includes an up and down circuit coupled to the DLL offset control circuit,
    the up and down circuit being configured to:
        receive the DLL offset code from the DLL offset control circuit; and
        adjust the DLL line code based on the DLL offset code.

8. The memory device of claim 6, wherein the DLL delay line trim circuit is coupled to the DLL offset control circuit, and configured to:
    receive the DLL offset code from the DLL offset control circuit; and
    adjust the DLL trim time based on the DLL offset code.

9. The memory device of claim 4, further including a feedback circuit to provide the DLL clock output from the circuit back to the DLL circuit as a feedback DLL clock,
    wherein the feedback circuit is configured to introduce a feedback delay time in the feedback DLL clock.

10. The memory device of claim 9, wherein the feedback circuit is coupled to the DLL offset control circuit to receive the DLL offset code, and is configured to adjust the feedback delay time based on the DLL offset code.

11. The memory device of claim 10, wherein the feedback circuit includes:
    a plurality of delay cells coupled in series, each delay cell providing a unit delay time; and
    a plurality of switches coupled in parallel with respective ones of the plurality of delay cells,
    wherein the plurality of switches are coupled to the DLL offset control circuit to receive the DLL offset code, and are configured to be switched on or off based on the DLL offset code.

12. The memory device of claim 1, wherein the DLL offset control circuit is configured to control the DLL delay time during a predetermined period after receiving the at least one of the functional statement commands.

13. A method of providing a data strobe signal by a delay locked loop (DLL) circuit, comprising:
    receiving an external clock by a DLL circuit disposed in a first power domain including a first power bus having a first voltage level;
    delaying, by the DLL circuit, the external clock by a DLL delay time to provide a DLL clock;
    outputting the DLL clock as the data strobe signal by an output driver disposed in a second power domain including a second bus having a second voltage level;
    receiving at least one of a plurality of functional statement commands by a DLL offset control circuit disposed in a third power domain including a third bus having a third voltage level, wherein the first, second, and third power domains being separated from each other;
    adjusting the DLL delay time based on the at least one of a plurality of functional statement commands to provide an adjusted DLL delay time; and
    delaying the external clock by the adjusted DLL delay time,
    wherein the functional statement commands control a connection between the DLL circuit and the first power bus in the first power domain, a connection between the output driver and the second power bus in the second power domain, and a connection between the DLL offset control circuit and the third power bus in the third power domain.

14. The method of claim 13, further including:
    generating a DLL offset code based on the at least one of a plurality of functional statement commands.

15. The method of claim 14, further including:
generating a DLL delay line code based on a difference between the external clock and the DLL clock;
delaying the external clock based on the DLL delay line code;
adjusting the DLL delay line code based on the DLL offset code to provide an adjusted DLL delay line code; and
delaying the external clock based on the adjusted DLL delay line code.

16. The method of claim 14, further including:
delaying the external clock by a DLL delay trim time;
adjusting the DLL delay trim time based on the DLL offset code to provide an adjusted DLL trim time; and
delaying the external clock by the adjusted DLL trim time DLL delay trim time.

17. The method of claim 14, further including:
receiving a DLL offset trim code; and
adjusting the DLL offset code based on the DLL offset trim code.

18. The method of claim 14, further including:
providing the DLL clock back to the DLL circuit as a feedback DLL clock; and
delaying the feedback DLL clock by a feedback delay time.

19. The method of claim 18, further including:
adjusting the feedback delay time by the DLL offset code.

\* \* \* \* \*